United States Patent
Richards et al.

(10) Patent No.: US 6,258,217 B1
(45) Date of Patent: Jul. 10, 2001

(54) ROTATING MAGNET ARRAY AND SPUTTER SOURCE

(75) Inventors: Edmond A. Richards; Paul R. Fournier, both of St. Petersburg; David Johnson, Palm Harbor; Abdul Lateef, Seffner; David G. Lishan, St. Petersburg; Shinzo Onishi, Palm Harbor; Mark D. Kenney, Safety Harbor, all of FL (US)

(73) Assignee: Plasma-Therm, Inc., St. Petersburg, FL (US)

( * ) Notice: Subject to any disclaimer, the term of this patent is extended or adjusted under 35 U.S.C. 154(b) by 0 days.

(21) Appl. No.: 09/406,853

(22) Filed: Sep. 29, 1999

(51) Int. Cl.[7] .................................................. C23C 14/35
(52) U.S. Cl. ................................ 204/192.12; 204/298.2; 204/298.19; 204/298.07; 204/298.12; 204/298.13
(58) Field of Search ........................... 204/192.12–298.19

(56) References Cited

U.S. PATENT DOCUMENTS

| | | | |
|---|---|---|---|
| 3,878,085 | 4/1975 | Corbani | 204/192.12 |
| 3,976,555 | 8/1976 | von Hartel | 204/192.12 |
| 4,166,018 | 8/1979 | Chapin | 204/298.19 |
| 4,422,916 | 12/1983 | McKelvey | 204/192.12 |
| 4,444,643 | 4/1984 | Garrett | 204/298.19 |
| 4,498,969 * | 2/1985 | Ramachandran | 204/298.2 |
| 4,581,118 | 4/1986 | Class et al. | 204/298.2 |
| 4,714,536 | 12/1987 | Freeman et al. | 156/345 |
| 4,746,417 | 5/1988 | Ferenbach et al. | 204/192.12 |
| 4,872,964 | 10/1989 | Suzuki et al. | 204/192.12 |
| 4,880,515 | 11/1989 | Yoshikawa et al. | 204/192.12 |
| 4,995,958 | 2/1991 | Anderson et al. | 204/298.19 |
| 5,026,471 * | 6/1991 | Latz et al. | 204/298.19 |
| 5,047,130 | 9/1991 | Akao et al. | 204/298.2 |
| 5,120,417 | 6/1992 | Takahashi et al. | 204/298.19 |
| 5,130,005 | 7/1992 | Hurwitt et al. | 204/192.12 |

(List continued on next page.)

FOREIGN PATENT DOCUMENTS

| | | |
|---|---|---|
| 0 211 412 | 2/1987 | (EP) . |
| 0 213 922 | 11/1987 | (EP) . |
| 0 439 360 | 7/1991 | (EP) . |
| 0 439 361 | 7/1991 | (EP) . |
| 0 555 339 | 8/1993 | (EP) . |
| 0 399 710 | 3/1994 | (EP) . |
| 0 620 583 | 10/1994 | (EP) . |
| 0 801 416 | 10/1997 | (EP) . |
| 0 820 088 | 1/1998 | (EP) . |

(List continued on next page.)

Primary Examiner—Mark F. Huff
Assistant Examiner—Daborah Chacko-Davis (57) ABSTRACT

A sputtering system and magnet array for depositing metal and metal-reactive gas coatings onto a substrate. The magnet array is designed for use in a rotating magnetron. The magnet array includes a plurality of magnets disposed on a plate. The plurality of magnets is arranged such that a closed-loop magnetic path is formed. The shape of the magnetic path is a double-lobe structure that includes first and second lobes that are symmetric to one another about an axis in the plane of the plate that intersects the center of rotation of the plate. The magnets are arranged in several rows. A first row of magnets has a double-lobe structure that corresponds to the first and second lobes of the magnetic path. Second and third rows of magnets are arranged in the shape of rings inside the first and second lobes of the magnetic path magnetic path. The lobe structure of the magnetic path can be circular or elliptical in shape. Using this design, a metal or metal-reactive gas coating can be deposited on the surface of the substrate at a high rate.

27 Claims, 8 Drawing Sheets

U.S. PATENT DOCUMENTS

| | | | |
|---|---|---|---|
| 5,164,063 | * 11/1992 | Braeuer et al. | 204/298.2 |
| 5,169,509 | * 12/1992 | Latz et al. | 204/298.03 |
| 5,171,415 | 12/1992 | Miller et al. | 204/298.09 |
| 5,182,003 | 1/1993 | Maass et al. | 204/298.23 |
| 5,188,717 | 2/1993 | Broadbent et al. | 204/298.2 |
| 5,194,131 | 3/1993 | Anderson | 204/192.12 |
| 5,248,402 | 9/1993 | Ballentine et al. | 204/298.2 |
| 5,252,194 | 10/1993 | Demaray et al. | 204/298.2 |
| 5,314,597 | 5/1994 | Harra | 204/298.3 |
| 5,320,728 | 6/1994 | Tepman | 204/192.12 |
| 5,330,628 | 7/1994 | Demaray et al. | 204/192.12 |
| 5,417,833 | 5/1995 | Harra et al. | 204/298.2 |
| 5,635,036 | 6/1997 | Demaray et al. | 204/192.12 |
| 5,830,327 | * 11/1998 | Kolenkow | 204/298.2 |

FOREIGN PATENT DOCUMENTS

| | | | |
|---|---|---|---|
| 62-211375 | 9/1987 | (JP) . | |
| 63-149374 | 6/1988 | (JP) . | |
| 3010072 | * 1/1991 | (JP) | 204/298.07 |
| WO 98/14631 | 4/1998 | (WO) . | |

* cited by examiner

ROTATING MAGNET ARRAY AND SPUTTER SOURCE

FIELD OF THE INVENTION

The present invention is directed to a method and apparatus for depositing metal and metal-reactive gas coatings onto a substrate.

BACKGROUND OF THE INVENTION

The sputter deposition of insulating films, particularly Aluminum Oxide ($Al_2O_3$), is conventionally accomplished by radio frequency ("RF") diode sputtering from a ceramic target. While somewhat effective, the RF diode sputtering process is quite slow with deposition rates of approximately 500 Angstroms/Minute. With such low deposition rates batch loading is required for economic machine throughput.

Batch processing involves coating multiple substrates in a single deposition run. However, batch processing has long been recognized by the semiconductor industry as less than optimum because of several factors. First, batch processing requires the use of larger targets, and thus much greater (and more expensive) power supplies are required. Second, there is an increased risk that wafer-to-wafer deposition uniformity will vary. Third, if there is a problem during a deposition run, multiple wafers will be lost. Thus, with batch processing, greater compromises must be made to distribute process results over the batch.

Single substrate processing, on the other hand, offers the benefits of better wafer-to-wafer deposition control and reduced losses in non-useable wafers due to deposition run problems. However, a commercially viable deposition rate would have to be increased by a substantial amount over the rate achievable in conventional RF diode sputtering systems. For example, a three times increase in deposition rate over the conventional RF diode approach would yield an acceptable rate for commercial applications. This increased rate can be achievable by utilizing a reactive sputtering process. In one reactive sputtering technique, an Aluminum target is placed in proximity to the presence of Oxygen to create an $Al_2O_3$ film as it is being deposited. The rate increase is realized because the sputter rate for metallic Aluminum is many times faster than for Aluminum Oxide and more conventional DC type power supplies can be used.

In addition to deposition rate, another important processing parameter is the deposition uniformity, which directly impacts the number of usable devices yielded from each substrate. An acceptable commercial deposition full range uniformity (of the coating layer thickness over the entire substrate) is <2% and is thus a major parameter in the source design. To achieve this kind of uniformity a large area sputter target would be needed.

To realize increased deposition rates for depositing metal films, conventional "magnetron" designs have been developed. These magnetron systems typically include a source, a metal target (typically Aluminum (Al) acting as a cathode), an electrode, and a substrate in close proximity to the electrode. A sputter gas medium, such as Argon (Ar) is introduced in the vacuum chamber and is ionized. The $Ar^+$ions accelerate towards the negatively charged target and collide with the target to release Al atoms that are deposited on the substrate.

One conventional magnetron design utilizes a stationary magnet to generate a magnetic field that is used to keep electrons from escaping the target vicinity before ionizing a number of Ar atoms which sputter the target. However, use of stationary magnets creates a "trenching" of the target which results in a non-uniform erosion of the target. This is disadvantageous because utilizing a non-uniform erosion pattern increases the risk that the deposited film will be non-uniform.

Other conventional sputter source designs include a rotating magnet to provide both high rate and large area coverage. These rotating magnet designs are typically offset (and are thus asymmetrical) with respect to the rotating axis and come in a variety of shapes, such as heart-shaped (cartioid) and apple-shaped rotating magnets. Examples of such magnet designs are provided in U.S. Pat. Nos. 4,995,958; 5,194,131; and 5,248,402. However, these conventional rotating magnet designs were developed almost exclusively for metal film deposition, and as such were not ideally suited for reactive sputtering.

Thus, what is needed is a magnet design, sputtering source and process that provides an acceptable quality film (in terms of film uniformity) on a substrate, where the deposition rate is sufficiently fast to allow single substrate processing (as opposed to batch processing) in order to eliminate the time and control problems stemming from the repeated venting of the substrate chamber under the conventional batch processing technique. Automated handling with a single substrate processing technique is desirable for its reduction in processing time, as well as providing for process control benefits.

SUMMARY OF THE INVENTION

In view of the foregoing, it would be desirable to provide a magnet array for a rotating magnetron sputtering system. A plurality of magnets are disposed on a plate. The plurality of magnets is arranged such that a magnetic path is formed. The shape of the magnetic path is a double-lobe structure that includes first and second lobes that are symmetrical about an axis in the plane of the plate that intersects a center of rotation of the plate. In one embodiment, the magnets are arranged in several rows. A first row of magnets has a double-lobe structure that corresponds to the first and second lobes of the magnetic path. Second and third rows of magnets are arranged in the shape of a rings inside the first and second lobes of the magnetic path magnetic path. The lobe structure is designed to maximize the erosion of the perimeter region of a sputtering target. For example, the lobe structure can be circular or elliptical in shape.

In view of the foregoing it is also desirable to provide a sputtering system for depositing a coating on a substrate. The sputtering system includes a metal sputtering target that is coupled to a power source, where the sputtering target shaped as an annulus.

The sputtering system also includes a rotatable magnet array disposed over the sputtering target. The magnet array can be shaped as in the embodiments described above. With this magnet array, the resulting magnetic path generates a substantially uniform erosion of the sputtering target.

In view of the foregoing, it is further desirable to provide a method for the high rate deposition of a metal-reactive gas material onto a substrate. To achieve a high deposition rate, a magnet array, such as the magnet arrays described in the preceding embodiments, is rotated in proximity to a metal sputtering target. The rotation of the magnetic path thereby generates a substantially uniform erosion of the sputtering target. A reactive gas is introduced proximate to a surface of the substrate to react with sputtered metal atoms released from the sputtering plate. The resulting metal-reactive gas coating deposits on the surface of the substrate at a high rate.

Further features and advantages of the invention, as well as the structure and operation of various embodiments of the invention, are described in detail below with reference to the accompanying drawings.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the pertinent art to make and use the invention. The drawings, however, do not limit the scope or practice of the invention.

DETAILED DESCRIPTION OF THE INVENTION

The present invention provides a sputtering system and magnet array for depositing metal and metal-reactive gas coatings onto a substrate. The metal-reactive gas coatings can be electrically conductive or insulating. The magnet array is designed for use in a rotating magnetron. In a preferred embodiment, the magnet array and sputtering system of the present invention are used for the high rate deposition of a dielectric material, such as an Aluminum Oxide coating, on a substrate. While the embodiments described herein are used to deposit Aluminum Oxide coatings on a silicon wafer substrate, the present invention is not limited for use with this particular coating or substrate, as would be apparent to one skilled in the art given the present description.

Figure 1:
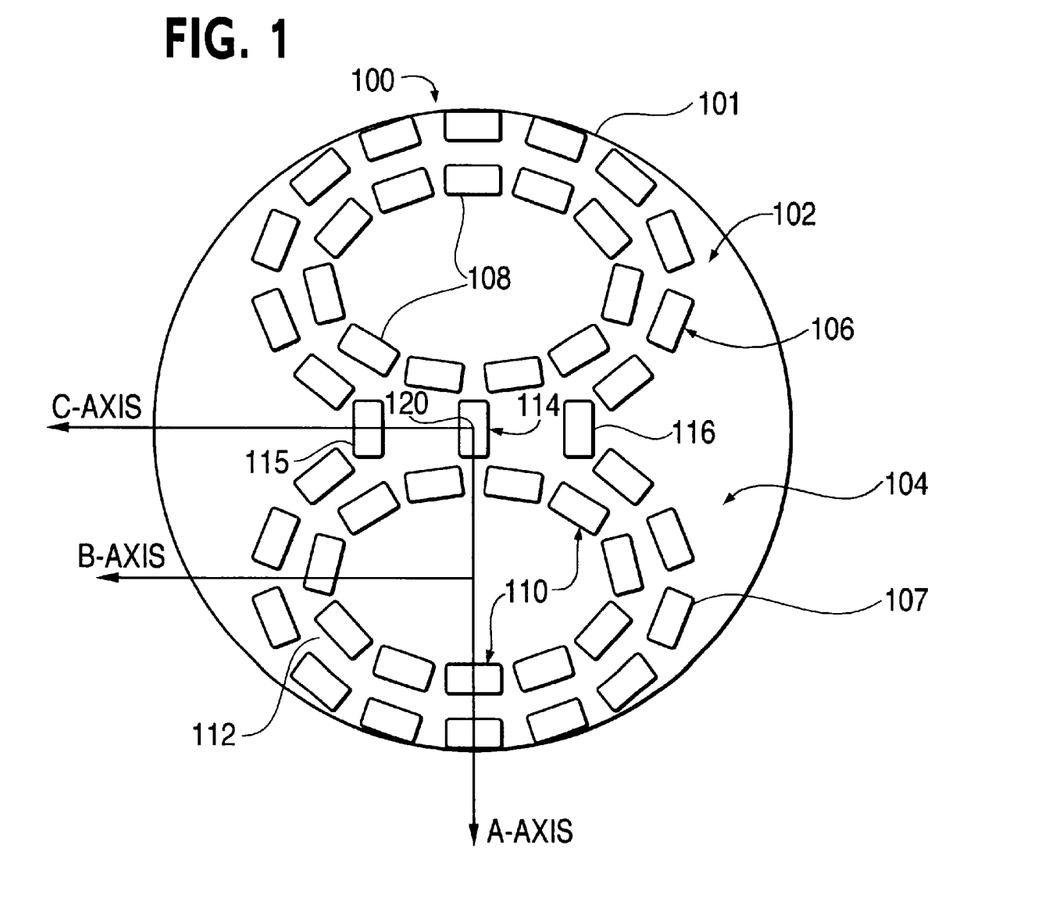
FIG. 1 is a schematic view of a magnet array according to an embodiment of the present invention.

FIG. 1 shows one embodiment of the invention, magnet array 100, which can be incorporated into the sputtering system of the present invention or a conventional rotating magnetron sputtering system to provide a high rate deposition of a metal or an insulating or dielectric film layer onto a substrate. A plurality of magnets are disposed on plate 101 that can be rotated about an axis, which corresponds to the center of rotation 120 of plate 101. Plate 101 is preferably circular, however the shape of plate 101 can be modified depending on the type of sputtering system used.

The magnet array of the present invention utilizes a symmetrical double-lobe design. For example, the magnet array design shown in FIG. 1 utilizes two elliptical magnetic lobes 102, 104 that overlap at the center of rotation 120 and are symmetric about the C-axis shown in FIG. 1. Lobe 102 includes an outer row (or ring) of magnets 106 and an inner ring of magnets 108. Lobe 104 includes an outer row of magnets 107 and an inner ring of magnets 110. The dual lobe nature of the present invention enables a higher deposition rate and greater yield of the sputtering target than in conventional magnet designs.

Figure 3:
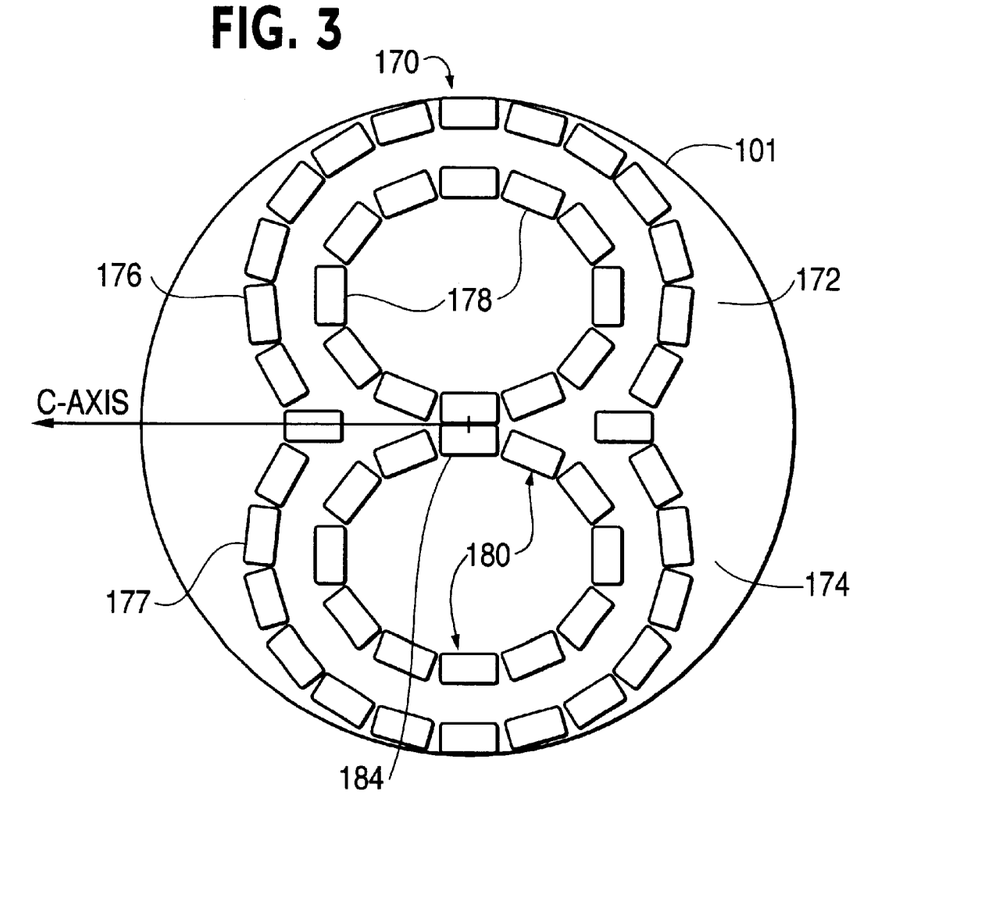
FIG. 3 is a schematic view of a magnet array according to another embodiment of the present invention.

In the embodiment shown in FIG. 1, the polarity of the magnets comprising outer rows 106 and 107 is North ("N") and the polarity of the magnets comprising inner rings 108 and 110 is South ("S"). Alternatively, the polarity of the magnets in the outer and inner rings can be switched. Optionally, a center magnet 114 can be utilized having the same polarity as inner rings 108 and 110. Center magnet 114 can be disposed directly over the axis of rotation. Alternatively, a center magnet set (such as shown in FIG. 3, described below) comprising two or more magnets can be disposed over the axis of rotation. A center magnet or center magnet set can be used to further control the resulting erosion profile of a target, such as by blocking the inner erosion of the target.

In the embodiment shown in FIG. 1, the magnets comprising magnet array 100 are all of the same magnetic field strength. Preferably, the magnets comprise rare-earth magnets such as Neodimium Iron Boron (NdFeB) magnets. These magnets have high pole field strengths on the order of 5000 Gauss. The example magnets shown in FIG. 1 each have a rectangular shape. Alternatively, the magnets utilized in magnet array 100 can comprise any shape, such as rectangular, square, or circular shapes.

A continuous erosion track or closed-loop erosion path 112 is formed between outer rows 106 and 107 and inner rows 108 and 110. In this embodiment without rotation, the erosion track resembles a "figure-8" (corresponding to the space between the outer and inner rows of magnets). Flux from one row of magnets to the other forms a tunnel. When sputtering, an intense plasma forms in the tunnel, and by rotating the magnet array, the plasma is swept around the surface of the target. Thus, when magnet array 100 is rotated, the sputter target surface is eroded over nearly the entire available surface area.

The separation between outer and inner rows of magnets controls both the shape of the magnetic flux lines running North to South and the magnetic field strength at the target surface. For example, if the outer and inner rows are separated too widely, the magnetic field strength will weaken. In addition, if the outer and inner rows are spaced too close together, the magnetic field strength also will weaken. Optimal separation depends on the magnet material and size as well as geometry of the sputtering structure. In this embodiment, acceptable results occur when the inner and outer rows of magnet array 100 are separated by about 15–30 mm.

Figure 4A:
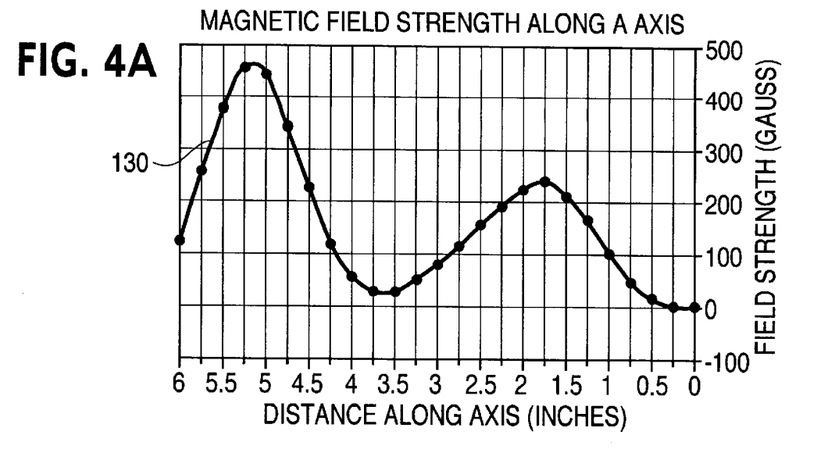
FIGS. 4A–4C are plots of the magnetic field strengths measured along the A-axis, C-axis and B-axis, respectively, for the magnet array of FIG. 1.
Figure 4B:
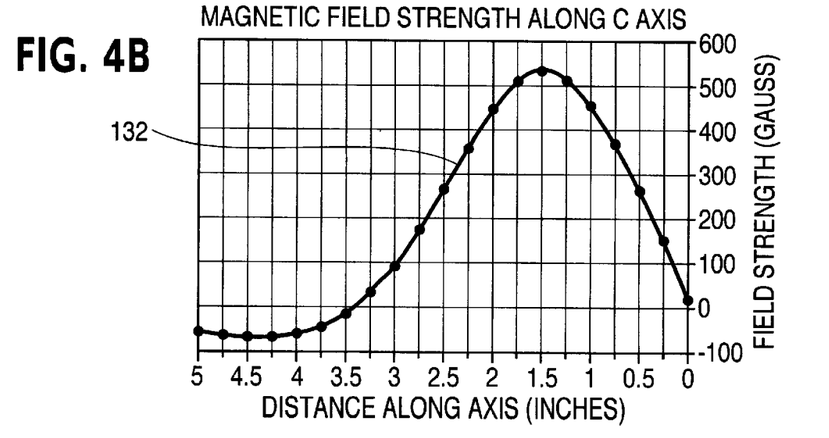
Figure 4C:
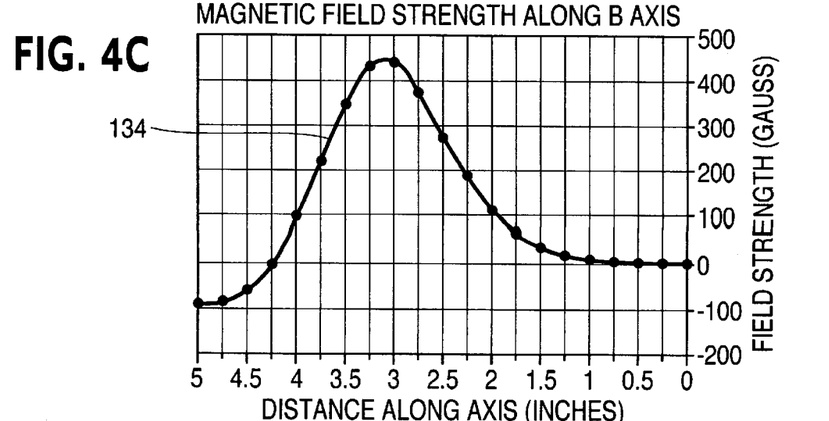

The magnetic field strength profiles parallel to the sputter target surface for magnet array 100 are shown graphically in FIGS. 4A–4C, where the resulting erosion pattern on the target follows the measured field strength when the magnet array is not rotating. These measurements were taken with a conventional magnetic field probe at a predetermined distance from the magnetic pole. The field strength was measured along the denoted axes as a function of radial distance from the center out towards the edge. The axes chosen were the A, B, and C axes denoted in FIG. 1. For example, as shown in FIG. 4B, along the C-axis, the magnetic field strength 132 is greatest between center magnet 114 and magnet 115 (and similarly between 114 and 116 due to the symmetrical magnet array design). This peak in field strength corresponds to the maxim erosion. Similarly, FIGS.

4A and 4C show magnetic field strength curves 130 and 134, respectively, which represent the field strengths along the A and B axes. By combining the field strengths along each of the axes and rotating these axes at the center of plate 101, a substantially uniform erosion track over the surface of the target is achieved. FIGS. 4A–4C show that the erosion track is substantially uniform, with varying field strengths of ±10% at all points greater than 0.5 inches from the center of the magnet array.

Figure 2:
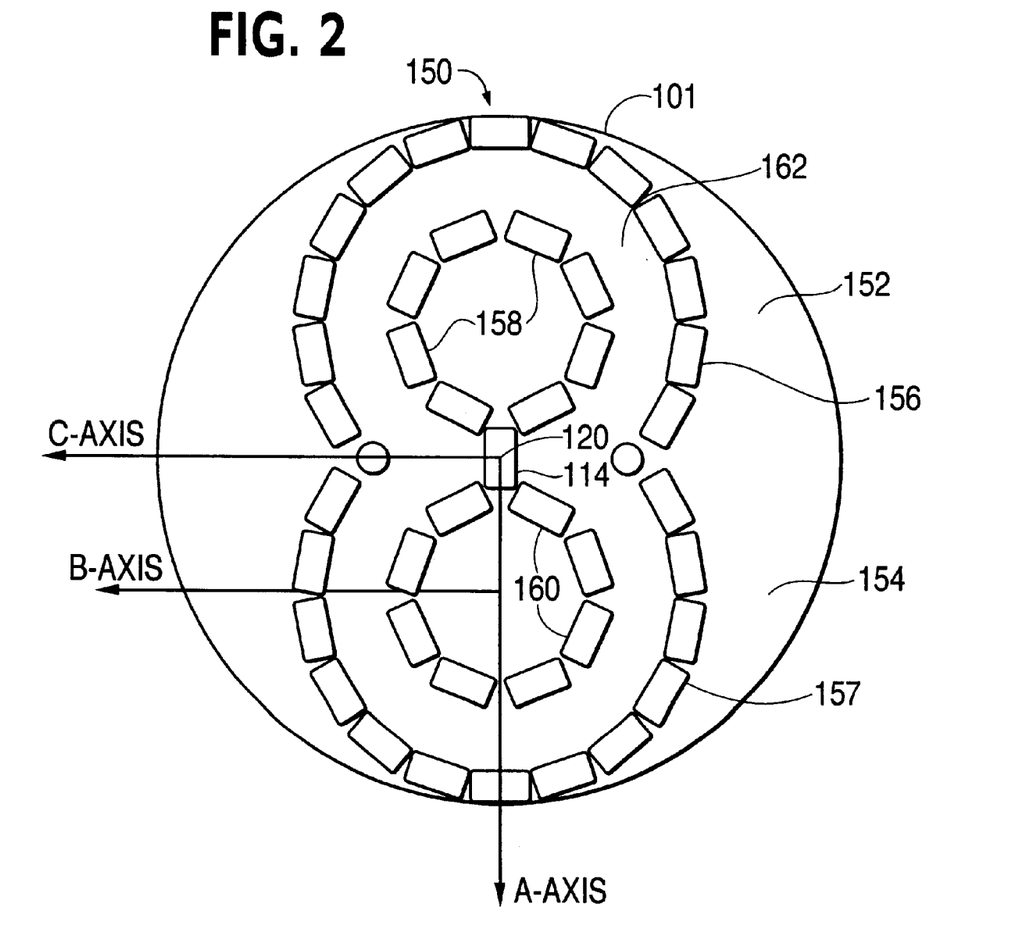
FIG. 2 is a schematic view of a magnet array according to another embodiment of the present invention.

According to the present invention, the curvature and strength of the lobe design can be varied depending on the sputtering target design, the erosion rate sought, and the type of film being deposited on the substrate. For example, another embodiment of the magnet array of the present invention is shown in FIG. 2. Magnet array 150 comprises a plurality of magnets disposed on plate 101 that can be rotated about an axis, which corresponds to the center of rotation 120 of plate 101. This design utilizes two circular magnetic lobes 152, 154 that overlap at the center of rotation 120 and are symmetric about the C-axis shown in FIG. 1. Lobe 152 includes an outer row of magnets 156 and an inner ring of magnets 158. Lobe 154 includes an outer row of magnets 157 and an inner ring of magnets 160. In this embodiment, the closed-loop erosion track 162 has a different target erosion profile than track 112 of magnet array 100.

Figure 5A:
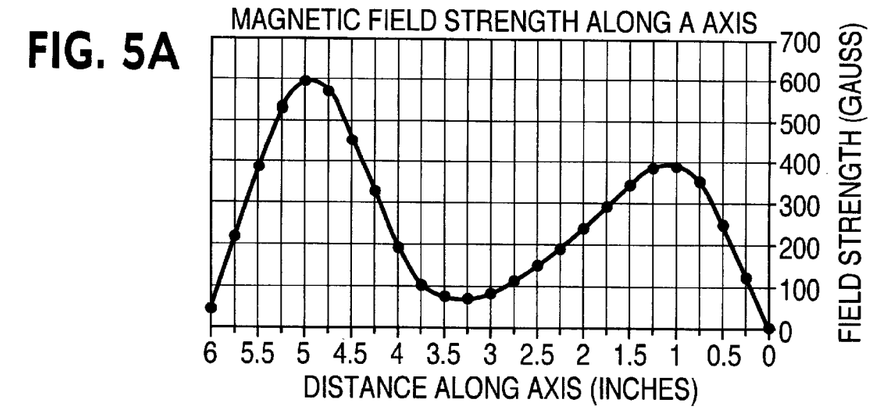
FIGS. 5A–5C are plots of the magnetic field strengths measured along the A-axis, C-axis and B-axis, respectively, for the magnet array of FIG. 2.
Figure 5B:
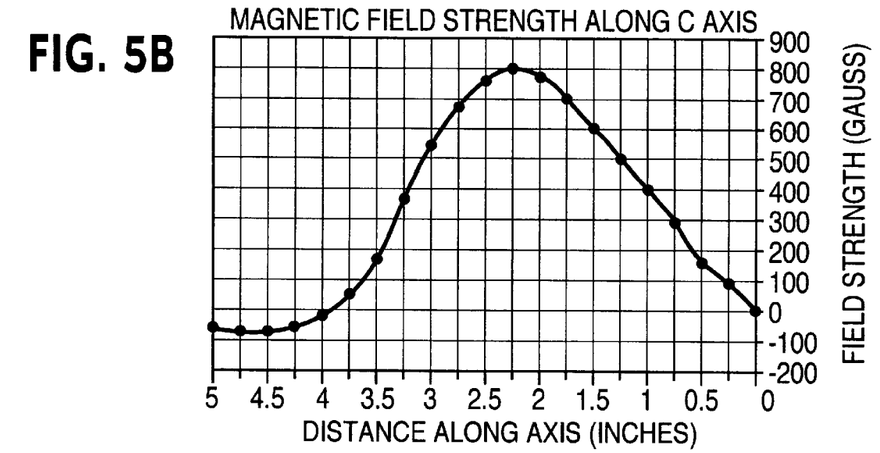
Figure 5C:
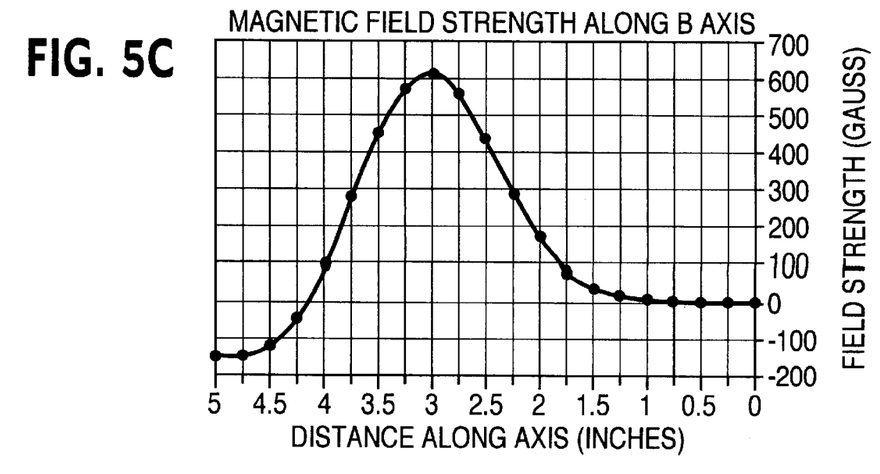

The magnetic field strength profiles perpendicular to the sputtering target surface for magnet array 150 are shown graphically in FIGS. 5A–5C, where the resulting erosion pattern on the target follows the measured field strength when the magnet array is not rotating. Similar to FIGS. 4A–4C, these measurements were taken with a conventional magnetic field probe at a predetermined distance from the surface. The field strength was measured as a function of radial distance from the center out towards the edge along an axis. The axes chosen were the A, B, and C axes denoted in FIG. 2.

Another embodiment of the magnet array of the present invention is shown in FIG. 3. Magnet array 170 comprises of plurality of magnets disposed on plate 101 that can be rotated about an axis, which corresponds to the center of rotation of plate 101. This design utilizes two circular magnetic lobes 172, 174 that are symmetric about the C-axis. Lobe 172 includes an outer row of magnets 176 and an inner ring of magnets 178. Lobe 174 includes an outer row of magnets 177 and an inner ring of magnets 180. In this embodiment, two magnets, or center magnet set 184, are disposed surrounding and proximate to (in this example, on either side of) the center of rotation of plate 101. Magnet set 184 can be used to control the resulting erosion profile of a target, in this case by blocking the inner erosion of the target.

According to the invention, the curvature of the lobe patterns controls the erosion profile. When depositing film with a more circular lobe profile, the deposition onto the substrate is reduced towards the outer edges. In order to increase the edge (of the substrate) deposition, a more elliptical magnet array design, such as magnet array 100, can be utilized to improve the uniformity and greater erosion rate towards the edges of the target.

For example, the elliptical lobe pattern of magnet array 100 of FIG. 1 is designed so that the curvature of the outer regions of magnet rows 106, 107, 108, and 110 have a flatter (as opposed to a more circular) shape, thereby increasing the rate from the edge of the target. With the double-lobe, elliptical design of magnet array 100, a greater magnetic field is available for eroding the target, as compared to conventional designs that use a single lobe that is asymmetrical with respect to the axis of rotation. Further, the more circular lobe design of magnet array 150 may be useful depending on the type of material being deposited on the substrate.

The symmetrical and dual-lobe design of magnet arrays 100, 150, and 170 generates an increased sputter rate (i.e., the amount of target sputtered off per unit time). According to the invention, the magnet array design should minimize the area of the target that is not sputtering. Otherwise, the target may accumulate material and begin to arc, which is damaging to the sputtering system. In addition, another design parameter of the present invention is based, at least in part, on the discovery by the inventors that the erosion profile in a reactive environment differs from that in a non-reactive environment. Thus, magnet array designs optimized for metal deposition may not be necessarily well suited for reactive applications.

Figure 6:
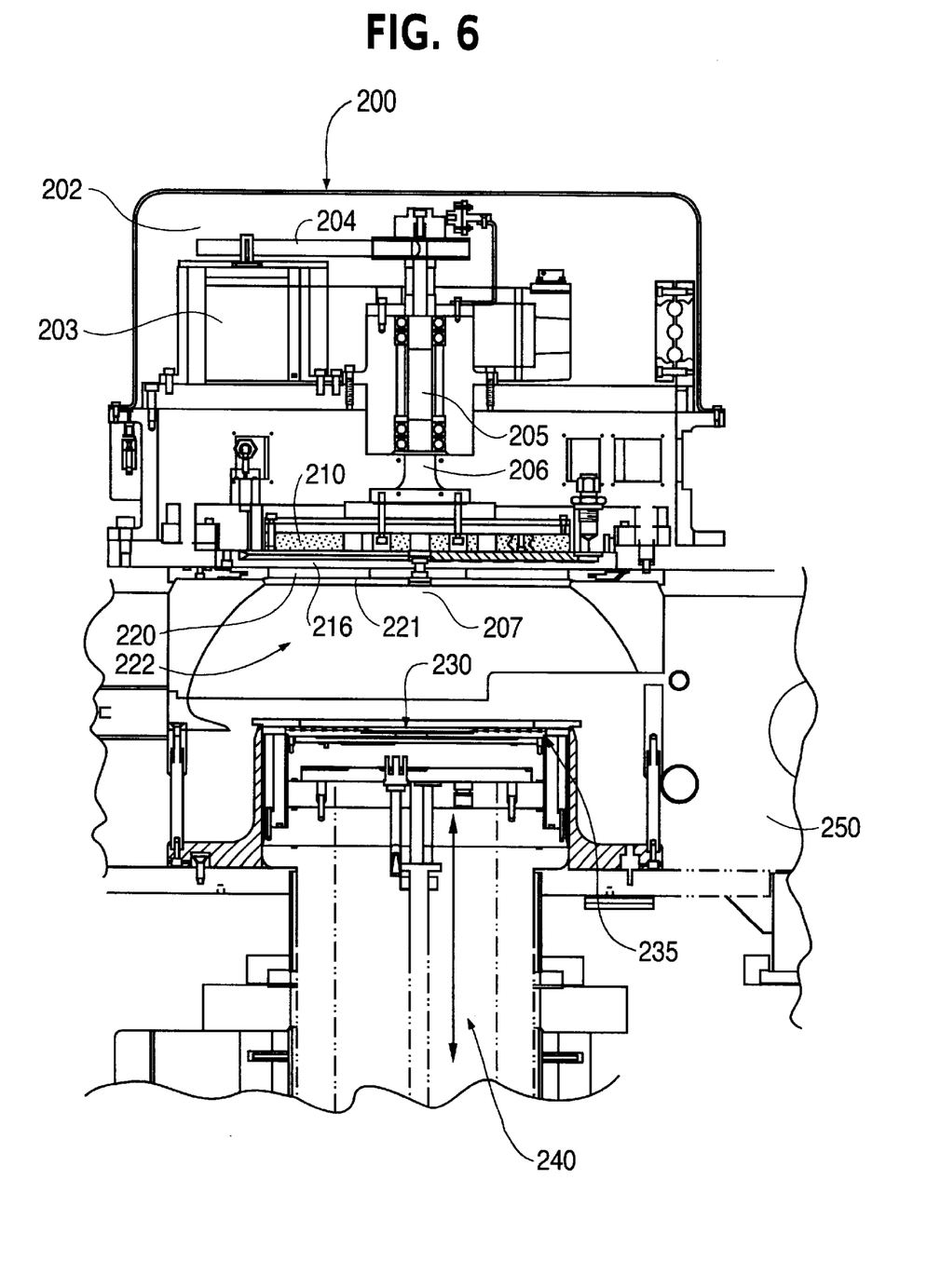
FIG. 6 is a schematic view of a sputtering system according to an embodiment of the present invention.

Taking the aforementioned design parameters into account, FIG. 6 schematically shows a sputtering system 200 that is capable of depositing a coating on the surface of a substrate at a high rate, according to one embodiment of the present invention. The coating can be a metal coating or a metal-reactive gas coating. Metal-reactive gas coatings can be electrically conductive or insulating. Example metal-reactive gas coatings include oxides such as $Al_2O_3$, zirconium oxide, silicon oxide, titanium oxide, and nitrides such as titanium nitride, aluminum nitride, silicon nitride, and the like. The embodiment of the present invention illustrated in FIG. 6 is not intended to be limiting, but rather an exemplary embodiment that produces desired results. Variations on the actual structure of the device shown in FIG. 6 will become apparent to those of skill in the art given the present description.

The main components of sputtering system 200 include a cathode assembly 202, a magnet array 210, a sputtering target 220, a substrate 230, a lower electrode 240, and a vacuum system 250. Cathode assembly 202 includes a source, such as conventional power supply (not shown) to activate the sputtering process. The target 220 is charged by the source to act as the cathode for the sputtering system. Target 220 can comprise any metal that is conventionally deposited on substrates, such as Aluminwn, Titanium, Copper, Chrome, Nickel-Iron (NiFe), and Titanium-Tungsten (TiW). In a preferred embodiment, target 220 is an aluminum plate shaped like an annulus. Target 220 is discussed in greater detail with respect to FIG. 8.

Sputtering system 200 also includes a rotational subsystem to rotate magnet array 210. In this embodiment, a motor 203 is coupled to a belt 204 which rotates a shaft 205 about axis of rotation 207 in a conventional manner. A spindle 206 can be used to mount magnet array 210. In this embodiment, magnet array 210 can comprise a magnet array 100, magnet array 150, or magnet array 170 discussed above or a variation based on the teachings herein. Motor 203 can have an adjustable speed. In operation, the spindle 206 rotates magnet array 210 to create a rotating field at the sputtering target surface.

Sputtering system 200 further includes a backing plate 216. In a preferred embodiment, backing plate 216 is electrically isolated and water cooled. Target 220 is attached or bonded to backing plate 216. The backing plate/target assembly is mounted to a vacuum chamber 250 such that the target surface 221 is positioned opposite the substrate 230 to be coated. The outside surface of the backing plate is placed at atmospheric pressure and positioned in front of magnet array 210.

A sputter gas medium, such as Ar gas, is introduced into reaction chamber 222. Ionized Ar+ atoms are attracted to the negatively charged target 220 during the sputtering process. A portion of the released Al atoms will eventually deposit on substrate 230, which is supported by lower electrode 240. In a preferred embodiment, electrode 240 includes a moveable platform that provides height adjustment for the substrate and allows for process repeatability. In addition, conventional magnetron control equipment (not shown), such as ion gauges, control computers, valve controllers, etc., can be utilized to optimize process repeatability, as will become apparent to those of skill in the art given the present description.

In the embodiment shown in FIG. 6, sputtering system 200 further includes a reactive gas injection unit 235 to provide for the introduction of a reactive gas, such as Oxygen or Nitrogen. For example, when using Oxygen gas, the $O_2$ reacts with the Al atoms released during the sputtering process to form a dielectric or insulating coating of $Al_2O_3$ on the substrate 230. Alternatively, if an electrically conductive coating is to be deposited, a coating such as titanium nitride, can be used to coat substrate 230. The reactive gas injection system 235 can include a shower ring injector to provide for the uniform introduction of the gas proximate to the exposed surface of substrate 230. Alternatively, for the deposition of metal-only layers onto a substrate, reactive gas injection system 235 would not be utilized.

Main vacuum chamber 250 can be a conventional vacuum system capable of creating a pressure ranging from $10^{-2}$ Torr to about $10^{-7}$ Torr in reaction chamber 222 with operating pressure in the range of $10^{-3}$ Torr.

Figure 7:
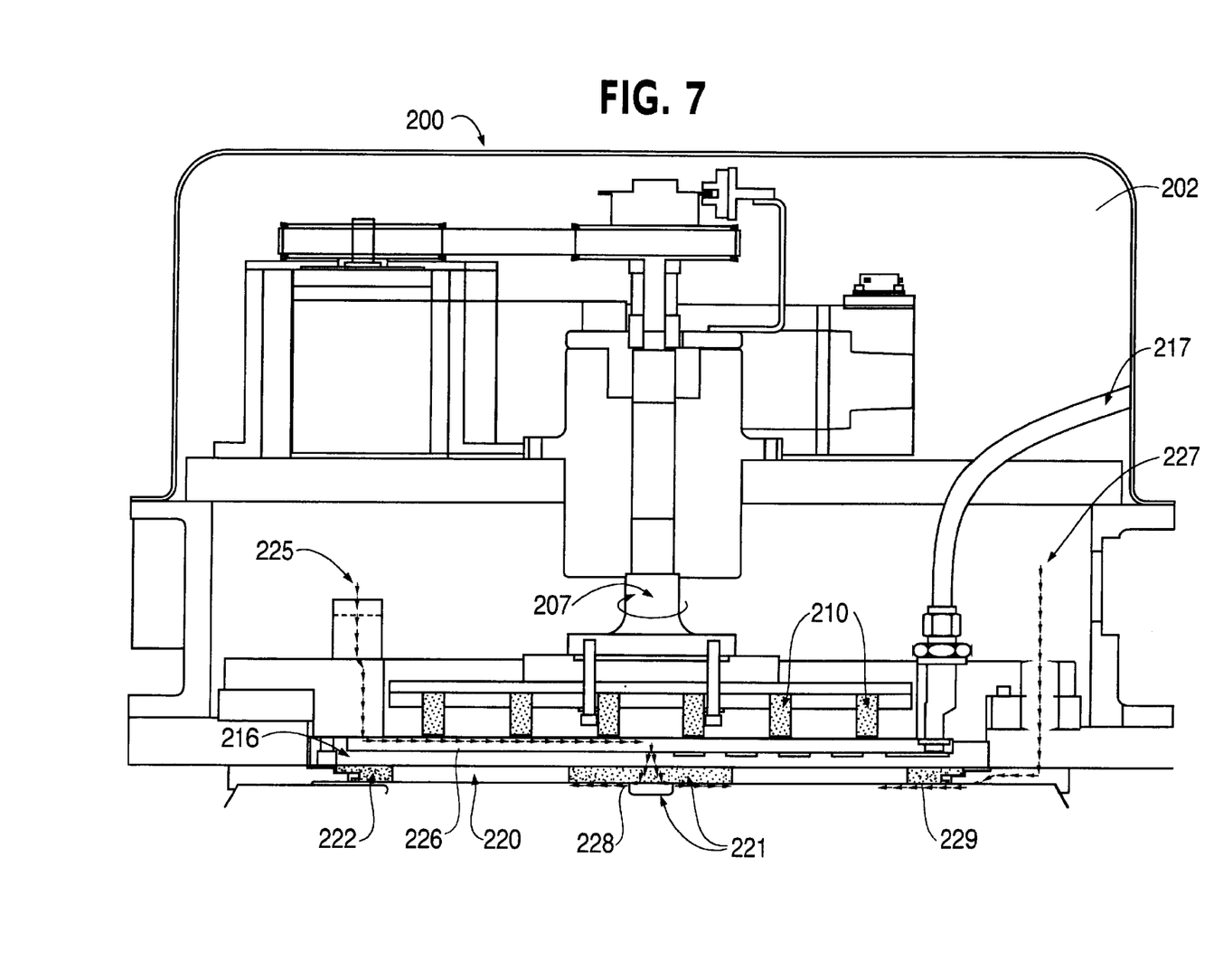
FIG. 7 is a schematic view of a sputtering source according to another embodiment of the present invention.

FIG. 7 schematically shows a more detailed view of several additional embodiments of sputtering system 200. Magnet array 210 is positioned over target 220, which is shaped as an annulus. As discussed above, target 220 is attached or bonded by conventional means to a liquid-cooled backing plate 216. Water, or other types of coolant, can be fed to a copper (or the like) backing plate 216 through coolant feed line 217, which is in fluid communication with a coolant conduit (not shown) in contact with backing plate 216. Cooling is important because during the sputtering process, the majority of the power applied to the target is converted to heat. Cooling also helps prevent the target from becoming de-bonded with backing plate 216. Further, by providing target cooling, sputtering source 200 can be temperature controlled during high rate sputtering applications.

Sputtering system 200 also provides several alternative mechanisms for injecting a sputter gas medium, such as Ar, into the reaction chamber for sputtering. In one alternative embodiment, sputtering system 200 includes a gas feed 225 which can be used to inject Ar gas substantially parallel to or across the surface of target 220. Gas flows from feed 225 along a first gas path or conduit 226 to a gas introduction port 228 located proximate to the central region of target 220. From gas introduction port 228, Ar gas can flow radially outward across the surface of the target 220, to further help provide uniform sputtering of the target.

In an alternative embodiment, sputtering system 200 include a perimeter gas feed 227, which is used to introduce Ar across the surface of target 220 from the perimeter of the target inward towards the central region along path 229. The perimeter gas feed 227 can be coupled to a conventional shower ring injector which is disposed outside the perimeter of target 220 and directs gas flow inward towards the central region of target 220. According to this embodiment of the present invention, Ar gas, or the like, can be introduced to the reaction chamber utilizing the above-mentioned mechanisms, either alone or in combination.

As discussed above magnet array 210 has magnetic field with a reduced erosion profile (or "dead spot") near its central region. According to the present invention, a dead spot can be utilized to help control the erosion profile. Typically, magnet arrays which are designed to sputter metal have a dead spot in the center. This is acceptable for metal deposition because the central region of the target is passive during sputtering. However, with reactive sputtering, the region of the target proximate to the dead spot does not sputter; rather, it can accumulate the dielectric compound and become a problem area in terms of arcing. If there is arcing, the process becomes unacceptable. According to an embodiment of the present invention, a ceramic insert or series of ceramic inserts can be used to reduce the arcing problem. A proper combination magnet array, the target and the ceramic inserts are designed to address these problems.

As shown in FIG. 7, sputtering system 200 can further include ceramic inserts 221 and 222. Outer ceramic insert 222 is disposed on the perimeter of target 222 and central ceramic insert 221 is disposed in the central region of target 220. In the embodiment shown in FIG. 7, central ceramic insert 221 can be further designed to allow a gas flow path for Ar gas that is introduced across target 220 at gas introduction port 228. Additional ceramic inserts can be designed to correspond to erosion path created by magnet array 210 in order to minimize arcing problems.

Figure 8:
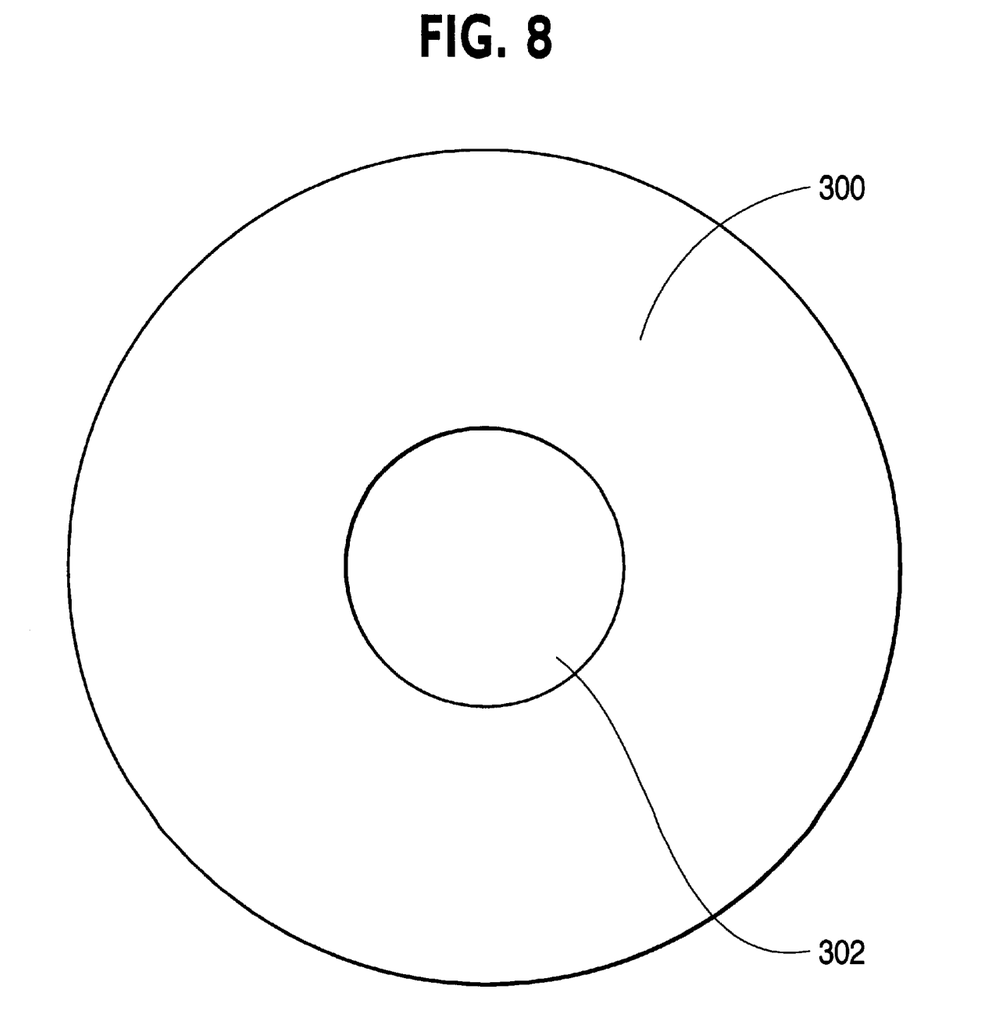
FIG. 8 is a schematic view of a sputtering target according to an embodiment of the present invention.

As mentioned above, the geometry of the magnet array is one factor in determining the rate at which material is removed from any point on the surface of the target. Tailoring of this erosion profile to achieve the desired process requirements is important in controlling deposition uniformity and rate. Another parameter in the control of erosion uniformity is the design of the target. FIG. 8 shows an embodiment where a metal target 300 to be used with the magnet array and sputtering system of the present invention. Metal target 300 is an annulus shaped structure composed of the target metal to be deposited on the substrate. As indicated above with respect to FIGS. 4A–4C, there exists a reduced magnetic field strength near the center region of the magnet array. Thus, the target can be configured to resemble an annulus, where the hole in central region 302 corresponds to the central dead spot. In this embodiment, target 300 has an outer diameter of about 11.5 inches and an inner diameter of about 2.5 inches. Of course, the specific configuration of target 300 can be optimized depending on the type of material to be deposited, the desired film characteristics, the size of the substrate, and the specific design of the magnet array being used. In addition, the annulus shaped target allows for the injection of the sputter medium gas through the central region, as discussed above with respect to FIG. 7.

EXAMPLE

A sputtering system, similar to that shown in FIGS. 6 and 7, was utilized to perform several experimental coating runs on silicon wafer substrate. An aluminum target was utilized having a shape similar to that shown for target 300 in FIG. 8. The outer diameter of the target was approximately 11.5 inches and the inner diameter was approximately 2.5 inches. A magnet array similar in shape to magnet array 100 from FIG. 1 was utilized. The magnet array was disposed on a 12 inch diameter circular plate and included 47 NdFeB magnets arranged in a symmetrical dual-lobe pattern, with each lobe having an elliptical shape. Each NdFeB magnet was rectangular shaped with a length of about 1 inch and a width of about 0.5 inches, with each having a magnetic pole field of about 5000 Gauss. The outer row of each lobe was N-polarized and the inner rows were S-polarized. The outer and inner rows of each lobe were separated by about 20 mm. A conventional pulsed DC plasma generator was used to supply about 4 KWatts of power to the sputtering target. The reactive gas ($O_2$) was introduced to the reaction chamber via a gas introduction system similar to that shown in FIG. 5.

Several experimental coating runs were performed. In each run, an $Al_2O_3$ coating was deposited on the exposed surface of the silicon wafer. On average, a deposition rate of about 1500 Angstroms/minute was achieved. This deposition rate represents a factor of three improvement over conventional RF diode sputtering methods. In addition, the full range "within wafer" $Al_2O_3$ film uniformity was within an acceptable commercial deposition uniformity, of about <2%.

Thus, with these achieved deposition rates and uniformity results, the magnet array and sputtering system of the present invention provides an acceptable single substrate processing device for semiconductor and other film deposition applications.

While the invention has been described in detail and with reference to specific embodiments thereof, it will be apparent to one skilled in the art that various changes and modifications can be made therein without departing from the spirit and scope of the invention. Thus, the breadth and scope of the present invention should not be limited by any of the above-described exemplary embodiments.

What is claimed is:

1. A magnet array for a rotating magnetron sputtering system, comprising:
   a plurality of magnets disposed on a plate and arranged to form a magnetic path, wherein a shape of said magnetic path includes first and second lobes that are symmetrical about first and second axes in the plane of said plate, said axes intersecting a center of rotation of said plate and being distinct from each other,
   wherein an arrangement of said plurality of magnets comprises:
      a first row of magnets having a double-lobe structure corresponding to said first and second lobes of said magnetic path; and
      second and third rows of magnets, wherein said second row is arranged in the shape of a ring inside said first lobe of said magnetic path, and wherein said third row is arranged in the shape of a ring inside said second lobe of said magnetic path.

2. The magnet array according to claim 1, wherein said arrangement of said plurality of magnets further comprises:
   a magnet disposed over the center of said plate.

3. The magnet array according to claim 1, wherein said arrangement of said plurality of magnets further comprises:
   a magnet set disposed proximate to the center of said plate.

4. The magnet array according to claim 1, wherein perimeter regions of said first, second and third rows have a flattened curvature to enhance erosion of a perimeter region of a sputtering target.

5. The magnet array according to claim 4, wherein the magnet array is used to deposit a dielectric coating on a substrate.

6. The magnet array according to claim 4, wherein the magnet array is used to deposit an electrically conductive coating on a substrate.

7. The magnet array according to claim 1, wherein said first and second lobes of the magnetic path are elliptically shaped.

8. The magnet array according to claim 1, wherein said first and second lobes of the magnetic path are circularly shaped.

9. The magnet array according to claim 1, wherein the first and second axes are orthogonal to each other.

10. A sputtering system for depositing a coating on a substrate, comprising:
    a metal sputtering target coupled to a power source, said sputtering target shaped as an annulus; and
    a rotatable magnet array disposed over said sputtering target, said magnet array including a plurality of magnets disposed on a plate and arranged to form a magnetic path, wherein a shape of said magnetic path includes first and second lobes that are symmetrical about first and second axes in the plane of said plate, said axes intersecting a center of rotation of said plate and being distinct from each other, said magnetic path generating a substantially uniform erosion of said sputtering target,
    wherein an arrangement of said plurality of magnets comprises:
       a first row of magnets having a double-lobe structure corresponding to said first and second lobes of said magnetic path; and
       second and third rows of magnets, wherein said second row is arranged in the shape of a ring inside said first lobe of said magnetic path, and wherein said third row is arranged in the shape of a ring inside said second lobe of said magnetic path.

11. The sputtering system according to claim 10 to deposit a metal-reactive gas coating on the substrate, further comprising:
    a reactive gas injector located proximate to the substrate to introduce a reactive gas into a reaction chamber operable at a pressure below atmosphere, wherein metal atoms react with said reactive gas to form a dielectric coating that is deposited on the substrate.

12. The sputtering system according to claim 11, wherein the reactive gas is Oxygen and the sputtering target consists of Aluminum.

13. The sputtering system according to claim 11, further comprising:
    a ceramic insert disposed proximate to a non-eroding portion of said sputtering target.

14. The sputtering system according to claim 13, further comprising:
    a central gas feed for introducing a sputter gas medium radially outward towards the perimeter and substantially parallel to a surface of said sputtering target, said ceramic insert providing a conduit for a flow of said sputter gas medium.

15. The sputtering system according to claim 10, wherein said arrangement of said plurality of magnets further comprises:
    a magnet disposed over the center of said plate.

16. The sputtering system according to claim 10, wherein said arrangement of said plurality of magnets further comprises:
    a magnet set disposed proximate to the center of said plate.

17. The sputtering system according to claim 10, wherein a rate of deposition of the metal-reactive gas coating is at least 1500 Angstroms/minute.

18. The sputtering system according to claim 10, wherein said coating is a metal.

19. A method for deposition of a metal-reactive gas material onto a substrate, comprising:

providing a magnet array that includes a plurality of magnets disposed on a plate and arranged to form a magnetic path, wherein a shape of said magnetic path includes first and second lobes that are symmetrical about first and second axes in the plane of said plate, said axes intersecting a center of rotation of said plate and being distinct from each other, wherein an arrangement of said plurality of magnets comprises:

a first row of magnets having a double-lobe structure corresponding to said first and second lobes of said magnetic path; and second and third rows of magnets, wherein said second row is arranged in the shape of a ring inside said first lobe of said magnetic path, and wherein said third row is arranged in the shape of a ring inside said second lobe of said magnetic path;

rotating said magnet array in proximity to a metal sputtering target, wherein the rotation of said magnetic path generates a substantially uniform erosion of said sputtering target; and introducing a reactive gas proximate to a surface of the substrate to react with sputtered metal atoms released from said sputtering target and to form a metal-reactive gas coating that deposits on said surface of said substrate.

20. The method according to claim 19, further comprising:

introducing a sputter gas medium in a central region of said sputtering target.

21. The method according to claim 19, wherein said target consists of aluminum and said reactive gas is Oxygen.

22. The method according to claim 19, wherein a rate of deposition of a dielectric coating is at least 1500 Angstroms/minute.

23. The method according to claim 19, wherein said magnet array further comprises a magnet disposed over the center of said plate.

24. The method according to claim 19, wherein said magnet array further comprises a magnet set disposed proximate to the center of said plate.

25. The method according to claim 19, wherein said first and second lobes of the magnetic path are elliptically shaped.

26. The method according to claim 19, further comprising:

providing a ceramic insert disposed proximate to a non-eroding portion of said sputtering target to reduce arcing.

27. The method according to claim 19 used in single substrate processing.

* * * * *